(12) United States Patent
Meyer et al.

(10) Patent No.: US 11,502,042 B2
(45) Date of Patent: Nov. 15, 2022

(54) PROCESSING OF ONE OR MORE CARRIER BODIES AND ELECTRONIC COMPONENTS BY MULTIPLE ALIGNMENT

(71) Applicant: Infineon Technologies AG, Neubiberg (DE)

(72) Inventors: Thorsten Meyer, Regensburg (DE); Thomas Behrens, Wenzenbach (DE); Martin Gruber, Schwandorf (DE); Thorsten Scharf, Lappersdorf (DE); Peter Strobel, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/917,947

(22) Filed: Jul. 1, 2020

(65) Prior Publication Data
US 2021/0005557 A1 Jan. 7, 2021

(30) Foreign Application Priority Data
Jul. 4, 2019 (DE) ..................... 10 2019 118 174.7

(51) Int. Cl.
*H01L 21/301* (2006.01)
*H01L 21/46* (2006.01)
*H01L 21/78* (2006.01)
*H01L 23/544* (2006.01)
*H01L 23/00* (2006.01)

(52) U.S. Cl.
CPC ............ *H01L 23/544* (2013.01); *H01L 24/97* (2013.01); *H01L 2224/95136* (2013.01)

(58) Field of Classification Search
CPC .......... H01L 23/544; H01L 2223/54426; B81C 99/007
See application file for complete search history.

(56) References Cited

U.S. PATENT DOCUMENTS

| | | | |
|---|---|---|---|
| 8,201,326 B2 | 6/2012 | Ewe et al. | |
| 8,466,544 B2 | 6/2013 | Pagaila | |
| 2001/0010469 A1* | 8/2001 | Fukasawa | .......... G01R 31/2886 324/750.29 |
| 2005/0217787 A1* | 10/2005 | Murakami | .......... H01L 25/0657 257/E23.179 |
| 2006/0283011 A1 | 12/2006 | Muller et al. | |
| 2007/0114352 A1* | 5/2007 | Cruz et al. | .............. H01L 24/83 248/316.7 |
| 2010/0025839 A1 | 2/2010 | Nishikawa | |

(Continued)

FOREIGN PATENT DOCUMENTS

DE    10 2009 059 236    7/2010

*Primary Examiner* — Brian Turner
(74) *Attorney, Agent, or Firm* — Dicke, Billig & Czaja, PLLC (57) ABSTRACT

A method of mounting electronic components on one or more carrier bodies is disclosed. The method comprises providing a support body with at least one first alignment mark, mounting the one or more carrier bodies, each having at least one second alignment mark, on the support body by alignment between the at least one first alignment mark and the at least one second alignment mark. Thereafter, the method includes mounting the plurality of electronic components on a respective one of the one or more carrier bodies by alignment using the at least one second alignment mark.

16 Claims, 5 Drawing Sheets

(56) References Cited

U.S. PATENT DOCUMENTS

| | | |
|---|---|---|
| 2013/0087894 A1* | 4/2013 | Elliott .................... H01L 23/66 |
| | | 257/622 |
| 2014/0191381 A1* | 7/2014 | Lee ................. H01L 23/49575 |
| | | 257/676 |
| 2014/0242734 A1 | 8/2014 | Nishikawa |
| 2017/0033271 A1 | 2/2017 | Gruendl et al. |
| 2017/0278768 A1* | 9/2017 | Higgins, III ........ H01L 21/4828 |
| 2018/0061806 A1 | 3/2018 | Jung et al. |
| 2019/0043789 A1* | 2/2019 | Mangrum ......... H01L 23/49548 |
| 2019/0103313 A1 | 4/2019 | Tam |
| 2019/0237395 A1* | 8/2019 | Joshi .................. H01L 21/4825 |
| 2020/0357987 A1* | 11/2020 | Li ....................... G01R 15/202 |

\* cited by examiner

PROCESSING OF ONE OR MORE CARRIER BODIES AND ELECTRONIC COMPONENTS BY MULTIPLE ALIGNMENT

CROSS-REFERENCE TO RELATED APPLICATION

This Utility Patent Application claims priority to German Patent Application No. 10 2019 118 174.7, filed Jul. 4, 2019, which is incorporated herein by reference.

BACKGROUND

The present invention relates to methods of mounting electronic components on one or more carrier bodies, and to a semifinished product.

A package may comprise an electronic component, such as a semiconductor chip, mounted on a carrier, such as a leadframe. Packages may be embodied as encapsulated electronic component mounted on a carrier with electrical connects extending out of the encapsulant and being coupled with an electronic periphery.

US 2006/0283011 A1 discloses a method of mounting electronic components on one or more carrier bodies, wherein the method comprises: providing a support body with at least one first alignment mark; mounting the one or more carrier bodies, each having at least one second alignment mark, on the support body; and thereafter mounting the plurality of electronic components on a respective one of the one or more carrier bodies by alignment using the at least one second alignment mark. Multiple alignment procedures are carried out between the support body, the carrier bodies and the electronic components.

DE 10 2009 059 236 A1 discloses a method of manufacturing a semiconductor device, wherein a plurality of modules is provided. Each of the modules includes a carrier and at least one semiconductor chip attached to the carrier. US 2014/0242734 A1 discloses method of manufacturing a semiconductor device includes a method of mounting at a first semiconductor chip and a second semiconductor chip over a die pad of a leadframe, and inspecting a mounting position of at least one of the first semiconductor chip and the second semiconductor chip, wherein the leadframe includes a first mark formed to the die pad, for indicating a first mounting region for the first semiconductor chip, and a second mark formed to the die pad, for indicating a second mounting region for the second semiconductor chip, the first mark is different from the second mark.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the drawings.

DETAILED DESCRIPTION

There may be a need to accurately mount electronic components during manufacture of a package.

According to an exemplary embodiment, a method of mounting electronic components on one or more carrier bodies is provided, wherein the method comprises providing a support body with at least one first alignment mark, mounting the one or more carrier bodies, each having at least one second alignment mark, on the support body by alignment between the at least one first alignment mark and the at least one second alignment mark, and mounting the plurality of electronic components on a respective one of the one or more carrier bodies by alignment using the at least one second alignment mark.

According to another exemplary embodiment, a method of mounting electronic components on leadframe-type carrier bodies is provided, wherein the method comprises providing connecting the intermediate carrier body with attached electronic components to the carrier bodies on the support body, the electronic components are arranged at the correct position so as to be properly connectable with the respective carrier body. In order to ensure a proper alignment, also the intermediate carrier body may be provided with one or more respective alignment marks. Hence, the electronic chips may also be aligned with respect to the assigned carrier body.

In an embodiment, the method comprises picking the plurality of electronic components from a diced wafer and transferring the picked electronic components (in particular simultaneously) to the intermediate carrier body. On the disc-shaped wafer, the electronic components may be arranged in a circular pattern. Transferring the individual electronic components from the wafer to the intermediate carrier body may involve re-ordering the electronic components, for instance from the circular pattern on the wafer into one or more rectangular patterns on the one or more carrier bodies.

The method comprises separating the one or more carrier bodies and the electronic components into separate packages, each comprising part of one of the one or more carrier bodies and at least one of the electronic components. In the context of the present application, the term "package" may particularly denote an electronic device comprising one or more electronic components mounted on a carrier (i.e. a section of a previous carrier body) and optionally packaged using an encapsulant. Further optionally, one or more electrically conductive contact elements or interconnect structures (such as bond wires or clips) may be implemented in a package, for instance for electrically coupling the electronic component with the carrier. For instance, separation may be accomplished by mechanically cutting, laser cutting and/or chemically or plasma etching.

However, many different carrier bodies and carriers may be used with different embodiments, and the described leadframe is just an example.

In an embodiment, each of the one or more carrier bodies comprises a plurality of indentations, in particular stamped or etched indentations, each configured for accommodating a respective one of the electronic components. By etching or stamping cavities, the correct positioning of the electronic components on a respective carrier body may be further simplified.

At least one of the group consisting of the support body and the one or more carrier bodies comprises at least two different sets of alignment marks, said different sets being distinguishable by having different properties. In particular, said different sets may comprise a first set with larger spatial extension than a second set, said first set serving for rough alignment and said second set serving for precise alignment. Said different properties may for instance be different shapes and/or dimensions of the various alignment marks. By providing different sets of alignment marks on a respective body, different stages of alignment may be advantageously carried out on this basis. This further improves accuracy. In such an embodiment, a rough alignment using alignment marks of a first set may be advantageously combined with a fine-tuning of the alignment by taking into account the second set of alignment marks. The precision of the positional placement of the electronic components with respect to the assigned carrier body may thus be further improved.

In an embodiment, at least part of the alignment marks comprises or consists of one or more round features. It has turned out that round alignment marks may be more robust against artefacts during a manufacturing process.

There may be a need to accurately mount electronic components during manufacture of a package.

According to an exemplary embodiment, a method of mounting electronic components on one or more carrier bodies is provided, wherein the method comprises providing a support body with at least one first alignment mark, mounting the one or more carrier bodies, each having at least one second alignment mark, on the support body by alignment between the at least one first alignment mark and the at least one second alignment mark, and mounting the plurality of electronic components on a respective one of the one or more carrier bodies by alignment using the at least one second alignment mark.

According to another exemplary embodiment, a method of mounting electronic components on leadframe-type carrier bodies is provided, wherein the method comprises providing a support body, mounting the plurality of carrier bodies on the support body, and mounting each of the plurality of electronic components on a respective one of the carrier bodies, wherein said mounting comprises carrying out multiple alignment procedures between support body, carrier bodies and electronic components.

According to yet another exemplary embodiment, a semifinished product is provided which comprises a support body with at least one first alignment mark, one or more carrier bodies mounted on the support body, each having at least one second alignment mark, wherein a correlation between at least one the first alignment mark and the at least one second alignment mark enables alignment between the support body and the one or more carrier bodies, and a plurality of electronic components, each having at least one third alignment mark and each mounted on a respective one of the one or more carrier bodies, wherein a correlation between the at least one second alignment mark and the third alignment marks enables alignment between the one or more carrier bodies and the electronic components.

According to an exemplary embodiment, a manufacturing architecture for a batch manufacture of multiple packages on panel level may be provided. According to such a manufacturing procedure, one or preferably multiple carrier bodies (for instance leadframe bodies) may be mounted on a (in particular temporary) support body. Alignment between said one or more carrier bodies on the one hand and said support body (which may be removed before completing manufacture of the packages) may be accomplished by detecting and comparing alignment marks formed on both the support body and the carrier body. Additionally, the electronic components to be mounted on the one or more carrier bodies may be aligned with respect to the assigned carrier body making use of the alignment mark(s) of the carrier body which has or have already been used for aligning carrier body with respect to support body. By aligning the electronic components with respect to the assigned carrier body making use of the carrier body's (rather than the support body's) alignment mark(s), the mounting tolerance of the electronic components is only limited by the tolerance of the alignment mark(s) of the carrier body, and not additionally limited by the tolerance of the alignment mark(s) of the support body. Therefore, the described multilevel alignment procedure ensures a high positional accuracy and therefore a high reliability of the readily manufactured packages.

According to an exemplary embodiment, it is possible to increase the positioning accuracy for electronic component (in particular semiconductor die) placement by overlay of multiple (in particular global) alignment procedures. This may enable low effort panel level packaging for (in particular leadframe based) packages.

In the following, further exemplary embodiments of the methods and the semifinished product will be explained.

In the context of the present application, the term "electronic component" may in particular encompass a semiconductor chip (in particular a power semiconductor chip), an active electronic device (such as a transistor), a passive electronic device (such as a capacitance or an inductance or an ohmic resistance), a sensor (such as a microphone, a light sensor or a gas sensor), an actuator (for instance a loudspeaker), and a microelectromechanical system (MEMS). In particular, the electronic component may be a semiconductor chip having at least one integrated circuit element (such as a diode or a transistor) in a surface portion thereof. The electronic component may be a naked die or may be already packaged or encapsulated.

In the context of the present application, the term "carrier body" may particularly denote a physical body, in particular body comprising or consisting of electrically conductive material, being configured for mounting electronic components thereon. For instance, such a carrier body may be a preform of multiple individual carriers, each carrier being configured for carrying one or more electronic chips of a respective package. For example, a carrier body may be a leadframe, which may comprise an array of (in particular integrally connected) multiple leadframe units, each of which configured for carrying and electrically connecting a respective electronic component (such as a semiconductor chip) of an assigned leadframe package. A carrier body may be separated into individual carriers (for instance individual leadframe units) at the end of the manufacturing process of the packages, i.e. after having mounted and electrically connected the electronic components on the one or more carrier bodies (and optionally after at least partial encapsulation of at least part of the electronic components and the one or more carrier bodies).

In the context of the present application, the term "support body" may particularly denote a physical body serving as a temporary support (for instance support plate) for carrying one or preferably multiple carrier bodies during part of a process of manufacturing packages. The support body may be removed from the one or more carrier bodies with assembled electronic components (optionally encapsulated) before or after separation or singularization into separate packages.

In the context of the present application, the term "alignment mark" may particularly denote any detectable (in particular optionally detectable) feature on or of a respective body (in particular a support body, a carrier body, an electronic component, an intermediate carrier body and/or a connection body) which is capable of providing alignment information concerning the assigned body, in particular with respect to another body. Thus, an alignment mark may be detected as a position and/or orientation reference of the assigned body enabling a relative positioning or orientation of said body with respect to another body. For example, such an alignment mark may be a dedicated feature specifically formed for the purpose of aligning on and/or in the assigned body. However, it is alternatively possible that an intrinsic structural feature of said body is detected as alignment mark, for instance an edge of an electronic component or a carrier body. While the detection of a physical feature of the body itself may be simple, the individual, specific and dedicated formation of an alignment mark may be preferred since it involves a higher accuracy.

In the context of the present application, the term "semi-finished product" may particularly denote a structure comprising at least a support body, at least one carrier body and electronic components forming a preform of multiple packages which are not yet readily manufactured and hence not yet separated.

It should be said that the numbering of the alignment marks (i.e. first alignment mark(s), second alignment mark(s), third alignment mark(s), fourth alignment mark(s), fifth alignment mark(s), etc.) has been made in the present application for the sake of clarity only. However, the use of a larger number for denoting a respective alignment mark (for instance fifth alignment mark) does not imply necessarily the mandatory presence of all alignment marks with a smaller number (for instance first to fourth alignment marks). Thus, the numbering of the alignment marks is made for the purpose of a clear distinction between them only.

In an embodiment, the method comprises providing each of the plurality of electronic components with at least one third alignment mark, wherein mounting the plurality of electronic components on a respective one of the one or more carrier bodies involves an alignment between the at least one second alignment mark and the third alignment marks. Advantageously, also the electronic components may be provided with at least one respective alignment mark. Further advantageously, alignment between the respective electronic component and the assigned carrier body may then be accomplished by taking account a relation between the one or more alignment marks of the carrier body and the one or more alignment marks of the assigned electronic component. By taking this measure, a high accuracy during assembly of the electronic component(s) on the assigned carrier body may be achieved.

In an embodiment, the method comprises carrying out the alignment between the at least one second alignment mark and the third alignment marks without considering the at least one first alignment mark. By disregarding the one or more alignment marks of the support body for aligning the electronic components relative to the carrier bodies, it can be prevented that the tolerances of the alignment in relation between support body and carrier body and in relation between carrier body and electronic component(s) are summed. In contrast to this, by aligning the electronic component(s) with regard to the carrier body by taking into account the alignment mark(s) of the carrier body and optionally the alignment mark(s) of the electronic component(s), it can be prevented that the tolerances of the various alignment procedures sum up and reduce the overall accuracy of the component positioning.

In an embodiment, the method comprises detecting the at least one first alignment mark before mounting the one or more carrier bodies on the support body. For instance, such a detection may be an optical detection. For this purpose, a camera may capture an image of the support body for identifying the one or more first alignment marks.

In an embodiment, the method comprises detecting the at least one second alignment mark before mounting the one or more carrier bodies on the support body. Also the one or more second alignment marks of the one or more carrier bodies may be detected for instance optionally by the same camera detecting also the first alignment mark(s). Alternatively, a separate camera may be used for detecting the second alignment mark(s).

In an embodiment, the method comprises carrying out the alignment between the at least one first alignment mark and the at least one second alignment mark as a global alignment. Correspondingly, the method may comprise carrying out the alignment between the at least one second alignment mark and the third alignment marks as a further global alignment. Therefore, two global alignment procedures may be advantageously combined so as to obtain a high accuracy of the component assembly on the respective carrier body.

Preferably, a further global alignment procedure may be added what concerns the relation between the at least one second alignment mark of a carrier body and the third alignment marks of the electronic components, so as to further increase the positional accuracy.

In an embodiment, the method comprises mounting one or more connection bodies, each having at least one fourth alignment mark, on the one or more carrier bodies for electrically connecting the electronic components with a respective carrier body. For instance, in a scenario in which the electronic components are power semiconductor chips with vertical current flow, it may be preferred to electrically connect upper main surfaces of the assembled electronic components with upper main surfaces of the carrier body on which the electronic components are mounted. In one embodiment, this can be accomplished by the formation of wire bonds or wire ribbons, i.e. individually for each electronic component. However, in order to further improve the throughput and further promote the batch manufacturing architecture, it may also be possible to connect a common connection body to the electronic components and an assigned carrier body as a whole. Such a connection body may comprise multiple connection elements each configured for electrically coupling an upper main surface of a respective electronic component with an upper main surface of the assigned carrier body. In order to carry out such a batch procedure of electrically coupling the electronic components with the assigned carrier body not only efficiently, but also accurately, it is possible to provide one or more further alignment marks at the connection body. The alignment between connection body and assigned carrier body may then be accomplished by a mutual alignment between carrier body and connection body taking into account a correlation between both assigned alignment marks.

In an embodiment, each of the connection bodies is a clip frame. When the connection body is a clip frame, an integral structure may be attached to each carrier body providing at least one clip per electronic component. The clips of a clip frame may be interconnected when the clip frame is connected to the assigned carrier body. Such a clip may be a curved electrically conductive body accomplishing an electric connection with a high connection area between an upper main surface of a respective electronic component and an upper main surface of the respective carrier body. Upon singularizing the obtained structure to form individual packages, also the connection body may be separated, for instance into individual clips. Optionally, at least one further electronic component may be mounted above the connection body.

In an embodiment, the method comprises mounting the one or more connection bodies on the one or more carrier bodies by alignment between the at least one second alignment mark and the at least one fourth alignment mark. Thus, a high positional accuracy between connection body and assigned carrier body, and consequently between a respective connection element of the connection body and an assigned electronic component on the corresponding carrier body may be obtained.

In an embodiment, the method comprises encapsulating at least part of the electronic components and at least part of the one or more carrier bodies by an encapsulant. For instance, the encapsulant comprises or consists of a mold compound. In the context of the present application, the term "encapsulant" may particularly denote a substantially electrically insulating and preferably thermally conductive material surrounding (for example hermetically surrounding) an electronic component and optionally part of a carrier or carrier body to provide mechanical protection, electrical insulation, and optionally a contribution to heat removal during operation. Such an encapsulant may for instance be a mold compound. When encapsulating by molding, injection molding or transfer molding may be carried out, for example. Hence, the encapsulant may comprise a mold, in particular a plastic mold. For instance, a correspondingly encapsulated body (in particular electronic component with carrier or carrier body) may be provided by placing the body or bodies between an upper mold tool and a lower mold tool and to inject liquid or granular mold material therein. After solidification of the mold material, formation of the encapsulant is completed. If desired, the mold may be filled with particles improving its properties, for instance its heat removal properties. Other encapsulant material may be used as well.

In embodiment, the method comprises mounting the plurality of electronic components on an intermediate carrier body having at least one fifth alignment mark by alignment taking into account mounting positions and orientations of the at least one carrier body, and thereafter transferring the electronic components from the intermediate carrier body to the one or more carrier bodies by alignment using the at least one fifth alignment mark. Hence, it may be possible to pick the individual electronic components for instance from a diced or sawn wafer and place them on predetermined positions of an intermediate carrier body. The position at which the individual electronic components are placed during this procedure may be defined by taking into account the result of the alignment between the support body and the one or more carrier bodies. For example, if carrier bodies are arranged on the support body with some spatial inaccuracy, said spatial inaccuracy may be detected or determined based on identified alignment marks of support body and/or carrier bodies. This may allow, in turn, the determination at which positions the electronic components shall be mounted on the intermediate carrier body so as to ensure that, after connecting the intermediate carrier body with attached electronic components to the carrier bodies on the support body, the electronic components are arranged at the correct position so as to be properly connectable with the respective carrier body. In order to ensure a proper alignment, also the intermediate carrier body may be provided with one or more respective alignment marks. Hence, the electronic chips may also be aligned with respect to the assigned carrier body.

In an embodiment, the method comprises picking the plurality of electronic components from a diced wafer and transferring the picked electronic components (in particular simultaneously) to the intermediate carrier body. On the disc-shaped wafer, the electronic components may be arranged in a circular pattern. Transferring the individual electronic components from the wafer to the intermediate carrier body may involve re-ordering the electronic components, for instance from the circular pattern on the wafer into one or more rectangular patterns on the one or more carrier bodies.

In an embodiment, the method comprises separating the one or more carrier bodies and the electronic components into separate packages, each comprising part of one of the one or more carrier bodies and at least one of the electronic components. In the context of the present application, the term "package" may particularly denote an electronic device comprising one or more electronic components mounted on a carrier (i.e. a section of a previous carrier body) and optionally packaged using an encapsulant. Further optionally, one or more electrically conductive contact elements or interconnect structures (such as bond wires or clips) may be implemented in a package, for instance for electrically coupling the electronic component with the carrier. For instance, separation may be accomplished by mechanically cutting, laser cutting and/or chemically or plasma etching. After separation or singularization, a plurality of packages may be obtained each comprising at least a portion of a respective carrier body, and at least one electronic component mounted on said section of the carrier body. Optionally, each package may also comprise a portion of an encapsulant encapsulating the electronic components and at least part of the carrier bodies. Further optionally, each of the packages may comprise a section of the above-described connection body, for instance a connection element such as a clip. In contrast to this, the support body may be a temporary support body which may be removed from the carrier bodies prior to the singularization. Alternatively, also part of the support body may form part of the readily manufactured packages.

In an embodiment, the method comprises forming at least part of the alignment marks by at least one of the group consisting of etching, printing, laser grooving, drilling, routing, and stamping. However, any other procedures for forming the alignment marks are possible as well.

In an embodiment, the method comprises mounting the electronic components on the carrier structures by at least one of the group consisting of soldering, sintering, welding, and gluing. Thus, the electronic component may be mounted on its mounting region by at least one of the group consisting of a solder structure, a sinter structure, or a welding structure. Also adhesively mounting the electronic component on the mounting region is possible.

In an embodiment, each of the one or more carrier bodies comprises at least one leadframe. In particular, each carrier body may be separated into individual leadframe-type carriers so that each of the carriers comprises a die pad and a plurality of leads. In other words, the patterning or structuring procedure may be carried out in such a way so as to define separate leadframe portions for each later package. In such embodiments, a respective electronic component may be mounted on the die pad. The leads may extend and may separate from the die pad in an outward direction so as to serve as terminals for electrically contacting the encapsulated electronic component after encapsulating. An electric coupling between an electronic component and the leads may be accomplished by a connection structure such as a clip or a bond wire which may electrically bridge and thereby couple a main surface of the electronic component with a contact surface of a respective one of the leads.

A leadframe may thus comprise a set of pads, for instance a die pad and in addition one or more bond pads. A leadframe may be a sheet-like metallic structure which can be patterned so as to form one or more die pads or mounting sections for mounting the one or more electronic components of the package, and one or more lead sections for an electric connection of the package to an electronic environment when the electronic component(s) is/are mounted on the leadframe. In an embodiment, the leadframe may be a metal plate (in particular made of copper) which may be patterned, for instance by etching or laser processing. Forming the component carrier as a leadframe is a cost-efficient and mechanically as well as electrically advantageous configuration in which a low ohmic connection of the at least one electronic component can be combined with a robust support capability of the leadframe. Furthermore, a leadframe may contribute to the thermal conductivity of the package and may remove heat generated during operation of the electronic component(s) as a result of the high thermal conductivity of the metallic (in particular copper) material of the leadframe. A leadframe may comprise for instance aluminum and/or copper.

However, many different carrier bodies and carriers may be used with different embodiments, and the described leadframe is just an example.

In an embodiment, each of the one or more carrier bodies comprises a plurality of indentations, in particular stamped or etched indentations, each configured for accommodating a respective one of the electronic components. By etching or stamping cavities, the correct positioning of the electronic components on a respective carrier body may be further simplified.

In an embodiment, at least one of the group consisting of the support body and the one or more carrier bodies comprises at least two different sets of alignment marks, said different sets being distinguishable by having different properties. In particular, said different sets may comprise a first set with larger spatial extension than a second set, said first set serving for rough alignment and said second set serving for precise alignment. Said different properties may for instance be different shapes and/or dimensions of the various alignment marks. By providing different sets of alignment marks on a respective body, different stages of alignment may be advantageously carried out on this basis. This further improves accuracy. In such an embodiment, a rough alignment using alignment marks of a first set may be advantageously combined with a fine-tuning of the alignment by taking into account the second set of alignment marks. The precision of the positional placement of the electronic components with respect to the assigned carrier body may thus be further improved.

In an embodiment, at least part of the alignment marks comprises or consists of one or more round features. It has turned out that round alignment marks may be more robust against artefacts during a manufacturing process.

In an embodiment, at least part of the alignment marks comprises at least one of the group consisting of an alignment mark being coplanar with a surrounding surface, an alignment mark being elevated with regard to a surrounding surface, an alignment mark being lowered with regard to a surrounding surface, and an alignment mark extending as a through hole through a surrounding surface. Since all the mentioned alternatives are compatible with an optical detection of the alignment marks, there is a high degree of freedom of designing and forming the alignment marks during the manufacturing process.

In an embodiment, the at least one first alignment mark and the at least one second alignment mark are distinguishable by having different properties. For instance, said different properties may be different shapes and/or dimensions. For instance, the at least one first alignment mark may have a larger spatial extension than the at least one second alignment mark. For example, first alignment marks having a larger special extension may be properly detectable by a camera capturing an image of a larger area of a semifinished product. In contrast to this, second alignment marks having a smaller spatial extension may be detected for a more precise alignment, for instance by capturing an image of only a part of a semifinished product.

In an embodiment, the support body may be a support plate. For instance, such a support plate may be made of glass, plastic, ceramic or a sufficiently thick metal so as to properly support the one or more carrier bodies during the assembly of the electronic components and optionally during encapsulation. After having fulfilled this support function (for instance after having completed encapsulation), the temporary support plate may be again removed from the structure because the completion of the encapsulation has rendered the structure even without temporary support plate sufficiently robust. The temporary support plate may then be reused or recycled for a further manufacturing process or may be disposed.

In an embodiment, the assembled electronic components may be electrically connected to an assigned carrier body by clips, bond wires, and/or bond ribbons. A clip may be a three-dimensionally bent plate type connection element which has two planar sections to be connected to an upper main surface of the respective electronic component and an upper main surface of the carrier body, wherein the two mentioned planar sections may be interconnected by a slanted or vertical connection section. As an alternative to such a clip, it is possible to use a wire bond or ribbon bond which is a flexible electrically conductive wire or ribbon shaped body having one end portion connected to the upper main surface of the respective electronic component and having an opposing other end portion being electrically connected to the carrier body.

In an embodiment, the at least one electronic component experiences a vertical current flow during operation. The package architecture according to exemplary embodiments is particularly appropriate for high power applications in which a vertical current flow is desired, i.e. a current flow in a direction perpendicular to the two opposing main surfaces of the electronic component, one of which being used for mounting the electronic component on the carrier body and the other one being used for connecting the electronic component with the clip, bond wire or bond ribbon.

In an embodiment, the at least one electronic component comprises at least one of the group consisting of a controller circuit, a driver circuit, and a power semiconductor circuit. All these circuits may be integrated into one semiconductor chip, or separately in different chips. For instance, a corresponding power semiconductor application may be realized by the chip(s), wherein integrated circuit elements of such a power semiconductor chip may comprise at least one transistor (in particular a MOSFET, metal oxide semiconductor field effect transistor), at least one diode, etc. In particular, circuits fulfilling a half-bridge function, a full-bridge function, etc., may be manufactured.

As substrate or wafer for the semiconductor chips, a semiconductor substrate, i.e. a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

The above and other objects, features and advantages of the present invention will become apparent from the following description and the appended claims, taken in conjunction with the accompanying drawings, in which like parts or elements are denoted by like reference numbers.

The illustration in the drawing is schematically and not to scale.

Before exemplary embodiments will be described in more detail referring to the Figures, some general considerations will be summarized based on which exemplary embodiments have been developed.

Packaging on panel level may be possible at low packaging effort, due to the large panel size in combination with parallel processing. For leadframe packages, the thickness of the leadframe-type carrier body is in many cases quite high. Therefore, half-etched leadframes might be not the preferred choice, but stamped leadframes may be desired as carrier bodies for electronic components such as semiconductor chips. Such stamped leadframes as carrier bodies may be smaller than panel size. Therefore, it may be desired to place multiple leadframe-type carrier bodies onto a support body (or panel size carrier). In order to allow electronic component (in particular die) placement on the leadframe-type carrier bodies later, a proper alignment method for both, the panel level support body and the leadframe-type carrier body might be advantageous, as provided by exemplary embodiments.

Conventionally, leadframe based packages are usually not packaged on panel level with panel size larger than standard leadframe size (in particular maximum 100 mm×300 mm). Conventional panel related packaging technologies are typically not using leadframes as packaging carrier, but are sophisticated advanced packages such as fan-out packages.

For molded packages with leadframe type carrier bodies, panel level processing has conventionally been considered problematic in view of the size of leadframes being typically restricted. For stamping, a maximum available leadframe size may be 150 mm×600 mm, which is already an exceptional dimension. For etched leadframes, the size may be larger, but the leadframe thickness may be restricted due to the etching process.

An exemplary embodiment provides a process using (in particular stamped) leadframe type carrier bodies which may be formed with low manufacturing effort, combining it to large panel format using a common support body and involving a parallel manufacturing process with higher cost benefit and low effort in view of the parallel processing. More particularly, exemplary embodiments provide a highly beneficial alignment strategy for such a panel level package manufacturing architecture.

According to an exemplary embodiment, an alignment procedure for packaging (in particular leadframe based) packages in panel format is provided, preferably with the use of multiple carrier bodies which may be stamped or etched leadframes. Stamped leadframes may be provided with low technical effort in high volume and may allow thick metal.

In an embodiment, multiple carrier bodies (such as integral leadframe structures) may be placed on a support body by a pick and place process. The one or preferably more (in particular leadframe-type) carrier bodies may be equipped with alignment marks, as well as the preferably plate-shaped support body. Multiple alignment marks are possible on the support body, at different positions and of same, similar or different shape. The alignment system of a corresponding pick and place tool may recognize the alignment mark(s) before placing the carrier bodies on the support body. Also, the one or more carrier bodies may have alignment marks. Before being placed, the pick and place equipment may also detect those alignment marks and may then place the respective carrier body onto the support body according to the alignment of both above described alignment marks. This may be repeated, if applicable, for all carrier bodies which are to be placed on the support body.

In a following procedure, placement of electronic components (such as dies) may be performed. For instance, an interconnect material like solder, glue, flux, sinter paste or similar may be applied to connect to the electronic components on the one or more carrier bodies. Now, the pick and place system may align on the respective carrier body and on the electronic components for attaching the electronic components to the carrier body (in particular for attaching a die to the leadframe). It may be advantageous to align on the carrier body for placement of the electronic component, and not on the panel level support body, for keeping the tolerances low. For instance, the pick and place process may have a placement accuracy of for example ±25 µm in order to be high speed. If both placements (i.e. of carrier body such as leadframe, and of electronic components such as die) are performed with the alignment on the support body only, the tolerances may add, leading to for instance ±50 µm placement tolerance. This may be above a specification limit for leadframe based packages of for example ±25 µm in the presence of strict design rules and following processes. Alignment on the carrier body for component attach may be preferred to achieve accurate placement of the electronic components, but since positioning of the carrier body on the support body is also providing a tolerance, two different alignment systems can be used for panel based (in particular leadframe) packaging. Advantageously, alignment tolerances may not add for accurately packaging in view of the described alignment architecture, therefore an overlay of a plurality of global alignment systems may be highly preferably.

Figure 1:
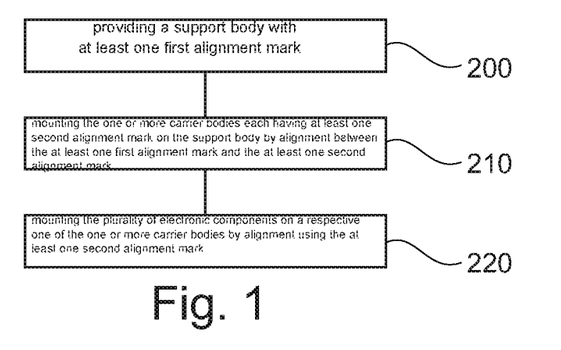
FIG. 1 illustrates a block diagram of a method of mounting electronic components on one or more carrier bodies according to an exemplary embodiment.

FIG. 1 illustrates a block diagram of a method of mounting electronic components 100 on one or more carrier bodies 102 according to an exemplary embodiment. With respect to the mentioned reference numerals, reference is made to FIG. 3.

As illustrated by a block 200, the method comprises providing a support body 104 with at least one first alignment mark 106.

Referring to a subsequent block 210, the method may further comprise mounting the one or more carrier bodies 102, each having at least one second alignment mark 108, on the support body 104 by alignment between the at least one first alignment mark 106 and the at least one second alignment mark 108.

As indicated by subsequent block 220, the method further comprises mounting the plurality of electronic components 100 on a respective one of the one or more carrier bodies 102 by alignment using the at least one second alignment mark 108.

Figure 2:
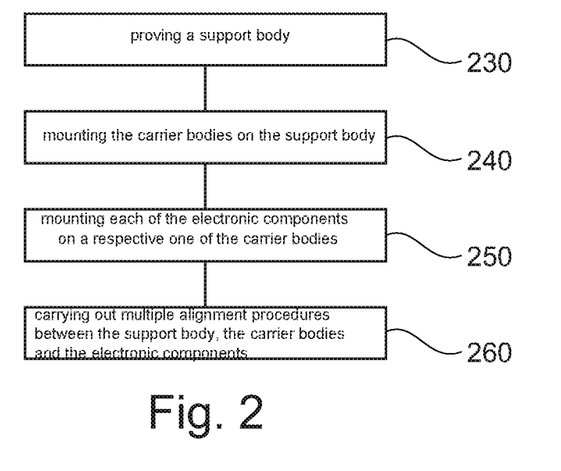
FIG. 2 illustrates a block diagram of a method of mounting electronic components on carrier bodies according to another exemplary embodiment.

FIG. 2 illustrates a block diagram of a method of mounting electronic components 100 on leadframe-type carrier bodies 102 according to another exemplary embodiment. With respect to the mentioned reference numerals, reference is made again to FIG. 3.

As shown by a block 230, the method comprises providing a support body 104.

A subsequent block 240 shows that the method further comprises mounting the carrier bodies 102 on the support body 104.

Subsequent Block 250 indicates that the method additionally comprises mounting each of the electronic components 100 on a respective one of the carrier bodies 102.

As illustrated by block 260, said mounting comprises carrying out multiple alignment procedures between the support body 104, the carrier bodies 102 and the electronic components 100.

Figure 3:
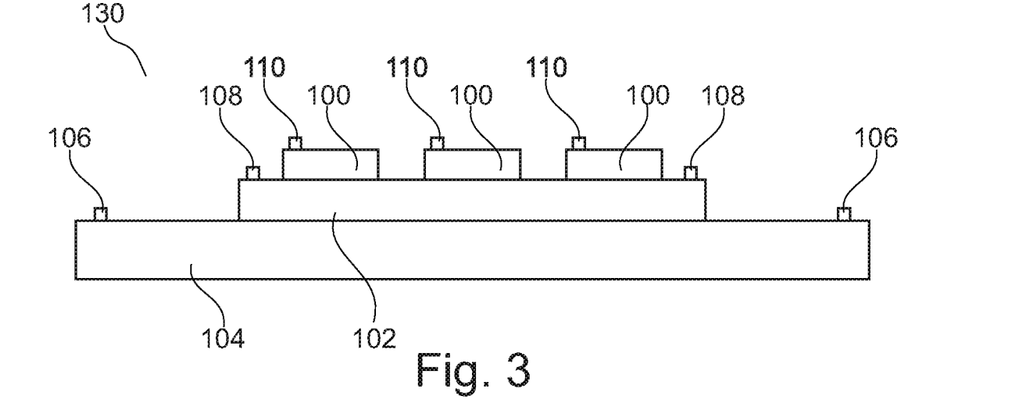
FIG. 3 illustrates a cross-sectional view of a semifinished product according to another exemplary embodiment.

FIG. 3 illustrates a cross-sectional view of a semifinished product 130 according to another exemplary embodiment.

The semifinished product 130 comprises a support body 104 with at first alignment marks 106. Furthermore, a carrier body 102 is mounted on the support body 104. The carrier body 102 comprises a plurality of second alignment marks 108. A correlation between the first alignment marks 106 and the second alignment marks 108 enables alignment between the support body 104 and the carrier body 102.

Moreover, the semifinished product 130 comprises a plurality of electronic components 100, each having a third alignment mark 110 and each mounted on the carrier body 102. A correlation between the second alignment marks 108 and the third alignment marks 110 may enable alignment between the carrier body 102 and the electronic components 100.

Figure 4:
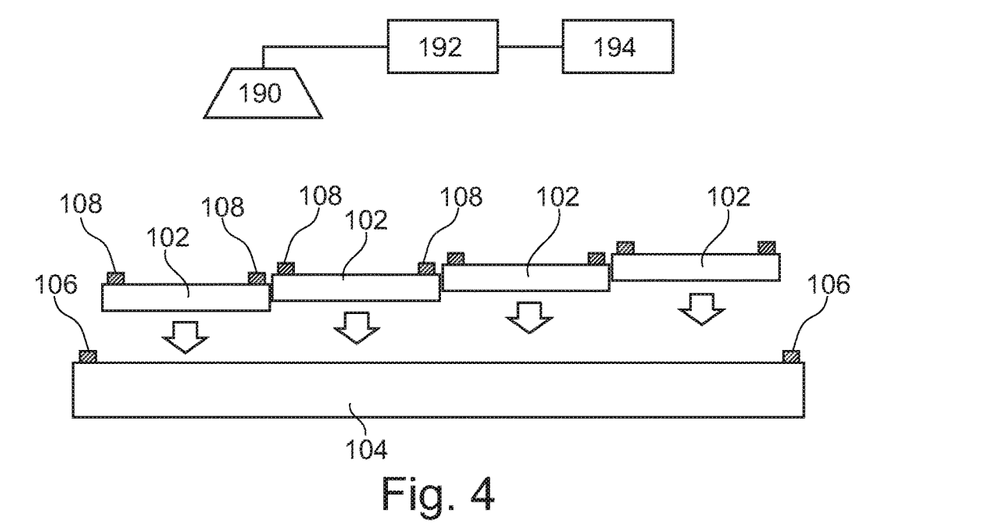
FIG. 4 and FIG. 5 illustrate structures obtained during carrying out a method of mounting electronic components on carrier bodies according to an exemplary embodiment.
Figure 5:
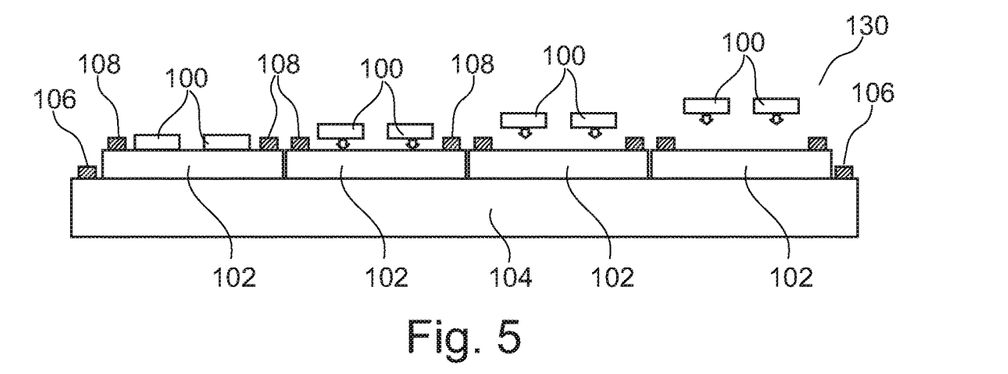

FIG. 4 and FIG. 5 illustrate structures obtained during carrying out a method of mounting electronic components 100 on carrier bodies 102 according to an exemplary embodiment. The two procedures illustrated according to FIG. 4 and FIG. 5 indicate a procedure for the alignment according to an exemplary embodiment.

Referring to FIG. 4, a support body 104 is provided with first alignment marks 106. Moreover, a plurality of carrier bodies 102, each having second alignment marks 108, is mounted on the support body 104 by global alignment between the first alignment marks 106 and the second alignment marks 108. The first alignment marks 106 are optically detected before mounting the carrier bodies 102 on the support body 104. Furthermore, the second alignment marks 108 are optically detected before mounting the carrier bodies 102 on the support body 104. For instance, the alignment marks 106, 108 may be formed by etching, printing, laser grooving, drilling, routing, and/or stamping.

In a first alignment procedure according to FIG. 4, a first global alignment is carried out between the leadframe-type carrier bodies 102 and the support body 104. The schematically shown vision system detects the alignment marks 106 of the support body 104. A pick and place apparatus may then place the carrier bodies 102, embodied as leadframes, accordingly on assigned surface regions of the plate-shaped support body 104.

FIG. 4 also illustrates components of an apparatus for carrying out the pick and place procedure of manufacturing packages based on the semifinished product 130 shown in FIG. 5. As shown, said apparatus comprises an optical detection unit 190 as vision system, such as a camera (for instance a CMOS camera or a CCD camera). The optical detection unit 190 may capture an image of the entire surface or part of the surface of the structure shown in FIG. 4 (and FIG. 5). The obtained image data may then be forwarded to an image recognition unit 192. The image recognition unit 192 may be configured for identifying the various alignment marks 106, 108, etc., for instance by carrying out an image recognition algorithm. The identified positions of the alignment marks 106, 108, and optionally an assignment of a respective detected alignment mark 106, 108 to either the support body 104 or a respective carrier body 102, may then be used by a control unit 194 for controlling the pick and place procedure to be carried out on the basis of said alignment results and thus with high precision.

FIG. 4 shows the example of multiple relatively small carrier bodies 102 (i.e. leadframes) on a larger panel-type support body 104. In the shown example, a single support body 104 is equipped with four carrier bodies 102. The alignment is carried out for all leadframe-type carrier bodies 102 with assigned alignment marks 108 in relation to the corresponding alignment marks 106 of the support body 104 for placement.

Referring to FIG. 5, mounting the plurality of electronic components 100 (in particular semiconductor chips) on a respective one of the carrier bodies 102 involves an alignment making use of the second alignment marks 108 (and optionally making use of third alignment marks, see reference numeral 110 in FIG. 3, which may be provided on the electronic components 100). Mounting the electronic components 100 on the carrier bodies 102 may be accomplished for example by soldering, sintering, welding, and/or gluing.

Preferably, carrying out a global alignment between the carrier bodies 102 and the electronic components 100 may be done without considering the first alignment marks 106, to thereby avoid an undesired addition of individual tolerances. As a result, the accuracy of the pick and place method is higher.

In the second partial procedure of the alignment according to FIG. 5, the electronic components 100 are placed on the carrier bodies 102 (in particular leadframes). The alignment marks 108 of the respective carrier body 102 are now serving as global alignment marks for the placement of the different electronic components 100. The vision system of the pick and place apparatus detects the alignment marks 108 of the carrier bodies 102 and places the electronic components 100 accordingly. The electronic components 108 may also be provided with alignment marks (not shown in FIG. 5, compare third alignment marks 110 in FIG. 3). The global alignment on the carrier bodies 102 serves for positioning of multiple electronic components 100.

Still referring to FIG. 5, placement of the die-type electronic components 100 on the small carrier bodies 102 (of leadframe type in the shown embodiment) on the larger panel-type support body 104 is illustrated. In the shown example, two electronic components 100 are mounted on each carrier body 102.

As a result, a semifinished product 130 is obtained as shown in FIG. 5. The semifinished product 130 comprises the support body 104 with its first alignment marks 106. The carrier bodies 102 are mounted on the support body 104. Each of the carrier bodies 102 is provided with assigned second alignment marks 108. A correlation between the first alignment marks 106 and the second alignment marks 108 enables alignment between the support body 104 and the carrier bodies 102. Moreover, each of the plurality of electronic components 100 is mounted on a respective one of the carrier bodies 102. The second alignment marks 108 enable alignment between the carrier bodies 102 and the electronic components 100.

The alignment marks 106, 108 (and optionally 110) may comprise round features being more robust against large tolerances and inaccuracies. For instance, the alignment marks 106, 108 (and optionally 110) may be coplanar with a surrounding surface, may be elevated with regard to a surrounding surface (as shown), may be lowered with regard to a surrounding surface, and/or may extend as a through hole through a surrounding surface. For instance, the first alignment marks 106 and the second alignment marks 108 may be optically distinguishable by having different properties, such as different shapes and/or different dimensions and/or different colors. In the shown embodiment, the first alignment marks 106 have a larger spatial distance from each other than the second alignment marks 108.

Figure 15:
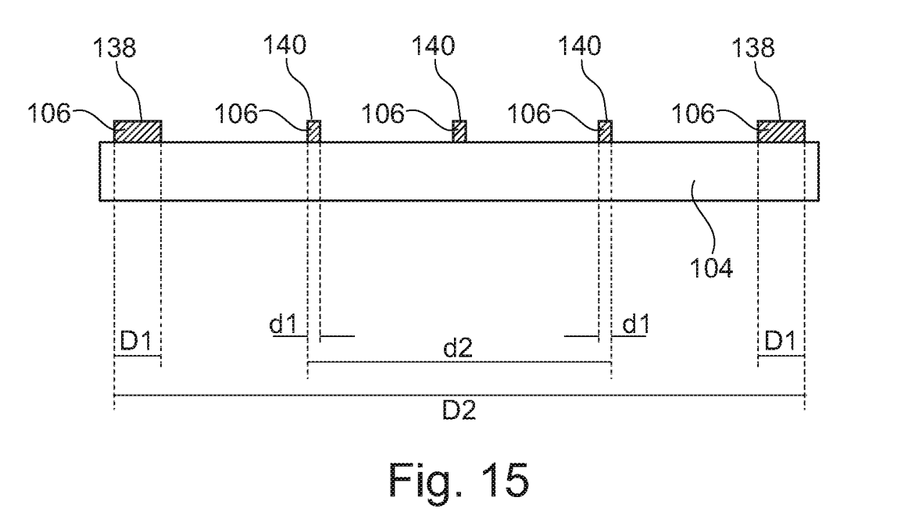
FIG. 15 illustrates a cross-sectional view of a support body with different sets of alignment marks according to an exemplary embodiment.

On one or both of the support plate 104 and the carrier bodies 102 also two or more sets of alignment marks 106, 108 can be used (not shown, compare FIG. 15). For instance, a first large set can be used for a rough alignment, while a second smaller set can be used for precise alignment.

The alignment marks 106, 108 on both the support body 104 and the carrier bodies 102 can be etched, printed, laser grooved, drilled, routed, stamped, or formed otherwise. They can be coplanar with the according surface, elevated, lower or even holes. Round features or patterns consisting of several round features may be preferred for etched marks as center detection may be less influenced by etching tolerances. If the recognition is done with a pattern comparison, patterns with large areas and clear signs may be preferred. Preferably, the first alignment marks 106 of the support body 104 may be different from the second alignment marks 108 of the carrier bodies 102. Also the size of the alignment marks 106, 108 can be different. So the first detection on the support body 104 may use larger alignment marks 106, which can be detected with a detection system with a wider field of vision while the second alignment marks 108 on the carrier bodies 102, which mainly influence the placement accuracy, are smaller and are visible with a smaller field of vision but higher resolution.

Although not shown in FIG. 4 and FIG. 5, the method may comprise encapsulating the electronic components 100 and part of the carrier bodies 102 by an encapsulant, such as a mold compound. Thereafter, the batch manufacturing method may comprise separating the carrier bodies 102 and the electronic components 100 encapsulated by said encapsulant into separate packages, each comprising part of a carrier body 102 and one of the electronic components 100, as well as part of the encapsulant (not shown).

Again referring to FIG. 4 and FIG. 5, a highly accurate placement of the electronic components 100 on the carrier bodies 102 can be accomplished by firstly aligning the carrier bodies 102 with respect to the support body 104 and subsequently aligning the electronic components 100 with respect to the carrier bodies 102 (and not with regard to the support body 104). By taking this measure, an undesired addition of multiple tolerances can be avoided and therefore a high spatial accuracy may be achieved.

FIG. 6 to FIG. 13 illustrate structures obtained during carrying out a method of mounting electronic components 100 on carrier bodies 102 according to another exemplary embodiment.

Figure 6:
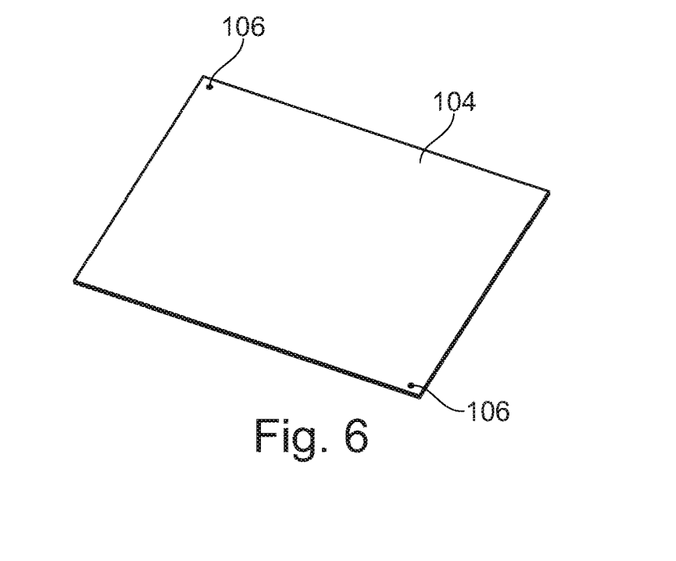
FIG. 6 to FIG. 13 illustrate structures obtained during carrying out a method of mounting electronic components on one or more carrier bodies according to another exemplary embodiment.

Referring to FIG. 6, a plate-shaped support body 104 with first alignment marks 106 in opposing corners is shown.

Figure 7:
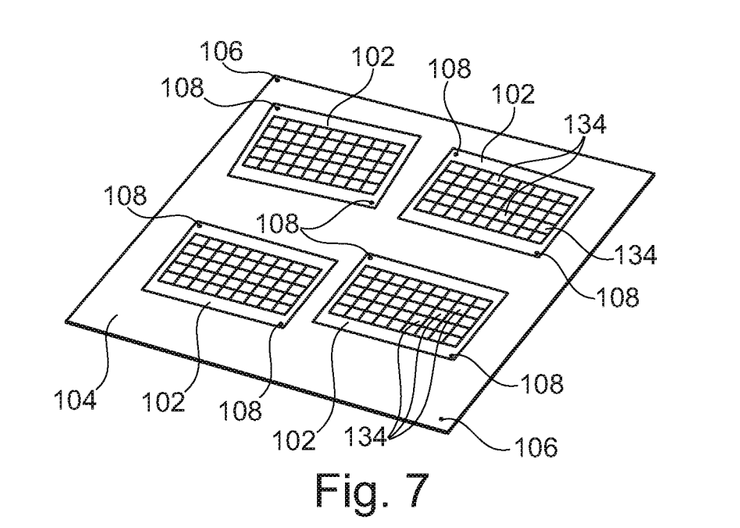

Referring to FIG. 7, four leadframe-type carrier bodies 102 with second alignment marks 108 in opposing corners are placed on the support body 104. A misalignment of carrier bodies 102 with reference to the first alignment marks 106 of the support body 104 may be measured, for instance optically based on the alignment marks 106, 108. As indicated schematically in FIG. 7, each of the leadframe-type carrier bodies 102 may comprise a plurality of still integrally connected leadframe units 134, each configured for mounting one or more electronic components 100 of a respective package. At the time of singularizing, each carrier body 102 may then be separated into the individual leadframe units 134.

Figure 8:
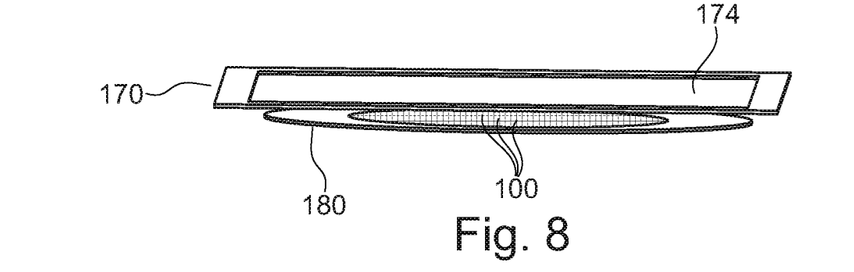

Referring to FIG. 8, transfer of electronic components 100 (in particular electronic chips) from a wafer 180 to an intermediate carrier body 170 may be accomplished. A protection foil 174 may be attached to the intermediate carrier body 170. Still referring to FIG. 8, the electronic components 100 of wafer 180 shall be assembled to the carrier bodies 102 for manufacturing packages. Although not shown, a pick and place apparatus may pick the individual electronic components 100 from the circular array from the sawn wafer 180 and may place them onto a main surface of a plate-like intermediate carrier body 170.

Figure 9:
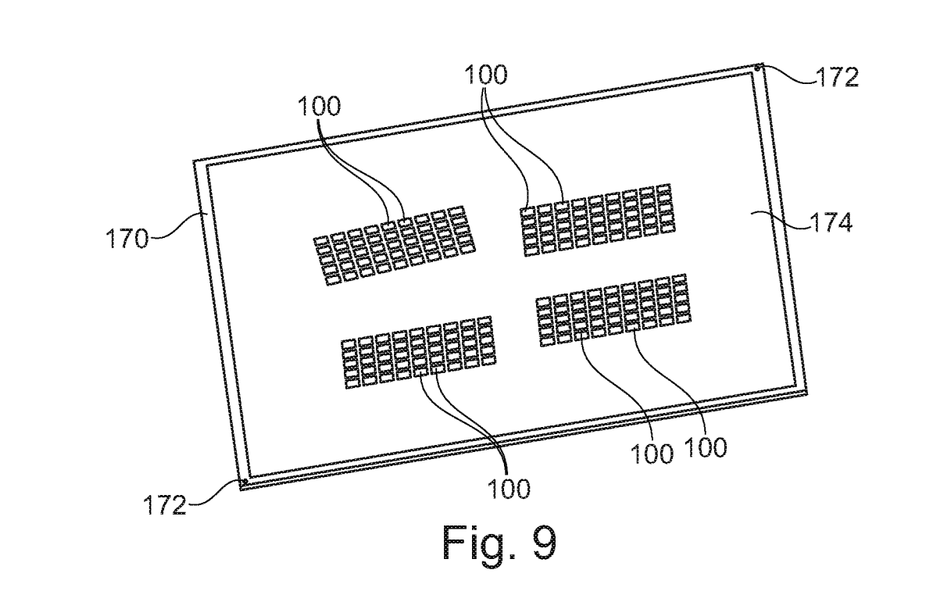

Referring to FIG. 9, an adjustment of the placing positions of the electronic chips 100 may be carried out by using data from the measurement carried out according to FIG. 7. The method may comprise picking the circularly arranged plurality of electronic components 100 from wafer 180 and transferring the picked electronic components 100 in rectangular patterns to the intermediate carrier body 170. In other words, the picked electronic components 100 may be placed on the intermediate carrier body 170 in accordance with the arrangement of the carrier bodies 102 on the support plate 104. The electronic components 100 are thus mounted on the intermediate carrier body 170, the latter having alignment marks 172. A corresponding alignment may take into account mounting positions and orientations of the carrier bodies 102 on support body 104. Thus, also the intermediate carrier body 170 is equipped with alignment marks 172 which can be optically detected. Hence, the placement of the electronic components 100 on the intermediate carrier body 170 may be accomplished under consideration of the alignment relation between the (slightly misaligned) carrier bodies 102 placed on the support body 104 in accordance with FIG. 7. In other words, the electronic components 100 are placed on the intermediate carrier body 170 intentionally with the same previously determined misalignment according to which the carrier bodies 102 are arranged on the support body 104. This may be accomplished by a comparison of the alignment marks 108 of the carrier bodies 102 with the alignment marks 106 of the support body 104 and by considering the relation between the alignment marks 172 of the intermediate carrier body 170 with the alignment marks 108 of the carrier bodies 102. Descriptively speaking, the electronic components 100 are attached to the intermediate carrier body 170 in accordance with the misalignment of the carrier bodies 102 on the support body 104. Thus, the misalignment of the carrier bodies 102 on the support body 104 is already repaired by a corresponding placement of the electronic components 100 on the intermediate carrier body 170. This allows bonding all electronic components 100 on the intermediate carrier body 170 on the assigned positions of the carrier bodies 102.

Figure 10:
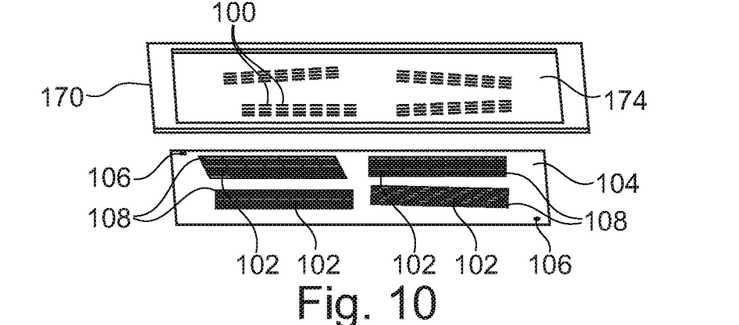

Referring to FIG. 10, the electronic components 100 are transferred from the intermediate carrier body 170 to the carrier bodies 102. A corresponding alignment procedure may make use of the alignment marks 172 of the intermediate carrier body 170. Descriptively speaking, a marriage of support body 104 and intermediate carrier body 170 may be accomplished by using the alignment marks 172.

The latter mentioned batch assembly procedure is illustrated in FIG. 10. FIG. 10 shows the arrangement between intermediate carrier body 170 with attached electronic components 100 on the one hand and the carrier bodies 102 on the support body 104 on the other hand from an oblique upper view.

Figure 11:
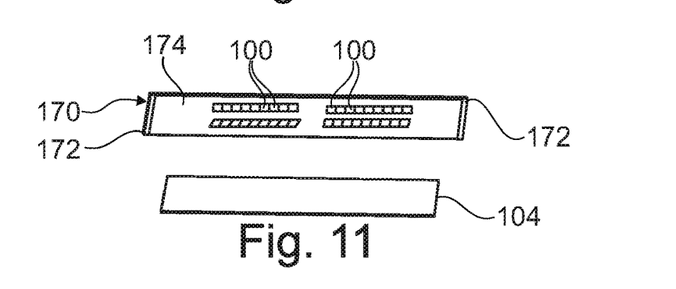

FIG. 11 shows an oblique lower view of the arrangement according to FIG. 10.

Figure 12:
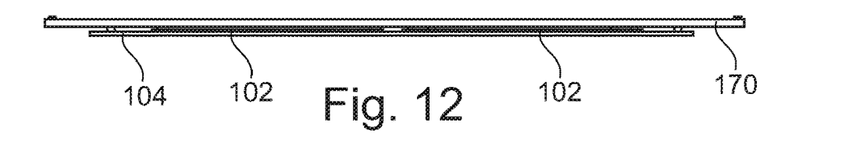

FIG. 12 shows the result of the connection of the intermediate carrier body 170 (with mounted electronic components 100) on the support body 104 (with mounted carrier bodies 102). Foil 174 may be removed from the intermediate carrier body 170.

Figure 13:
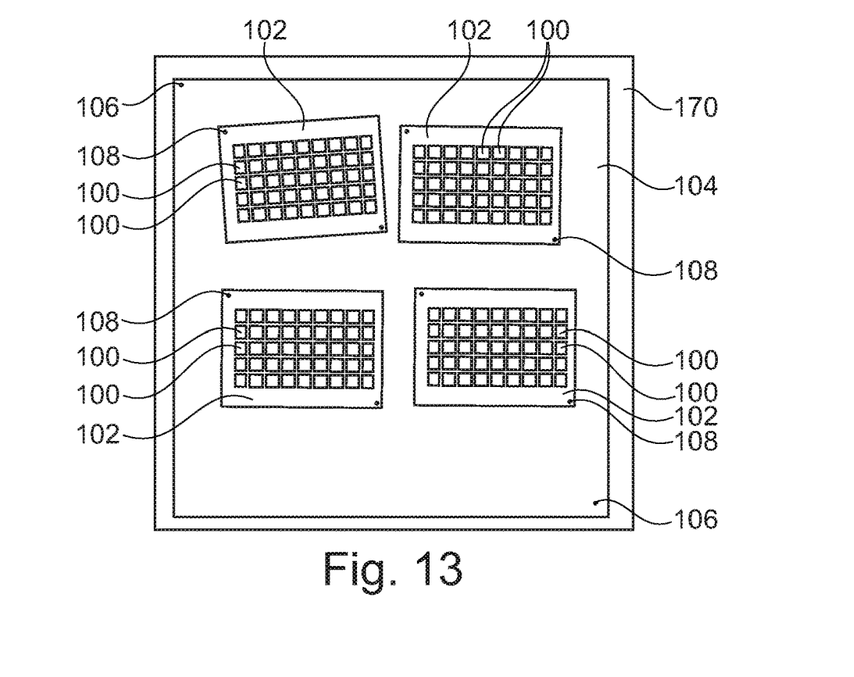

FIG. 13 schematically illustrates the result of the manufacturing procedure according to FIG. 11 and FIG. 12 in which the electronic components 100 are properly mounted on the carrier bodies 102 being mounted with a certain amount of misalignment on the support body 104. However, the relation between the electronic components 100 and the carrier bodies 102 is achieved with high positional accuracy thanks to the alignment results of the alignment between, on the one hand the support body 104 and the carrier bodies 102, and on the other hand, the intermediate carrier body 170 and the carrier bodies 102. Again, a high positional accuracy can be guaranteed by the described procedure.

Figure 14:
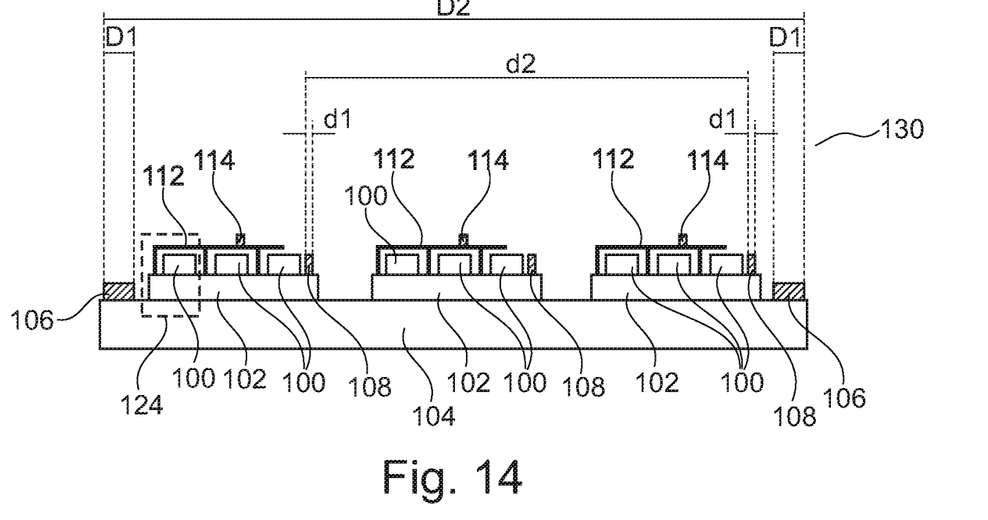
FIG. 14 illustrates a cross-sectional view of a semifinished product according to an exemplary embodiment.

FIG. 14 illustrates a cross-sectional view of a semifinished product 130 according to an exemplary embodiment.

The semifinished product 130 according to FIG. 14 may be obtained by mounting connection bodies 112, each having one or more alignment marks 114, on a respective one of the carrier bodies 102 for electrically connecting the electronic components 100 with a respective carrier body 102. In the shown embodiment, each of the connection bodies 112 is a clip frame. More precisely, the connection bodies 112 may be mounted on the carrier bodies 102 by alignment between the alignment marks 108 of the carrier bodies 102 and the alignment marks 114 of the connection bodies 112.

Thus, the described embodiment uses a further set of alignment marks 114. For instance a clip frame or any other connection body 112, which includes this further set of alignment marks 114, is placed on the leadframe-type carrier bodies 102 after (for instance first) attach of the electronic components 100. Both latter processes may use the set of alignment marks 108 on the carrier bodies 102.

If desired, a second electronic component (for instance a further semiconductor chip) may be bonded on top of the clip (and may optionally contain at least one further alignment mark, not shown) using the alignment marks 114 on the clip-frame type connection body 112 for alignment. Wire bonding can now use the marks on the last electronic component (not shown).

FIG. 14 shows an embodiment in which connection bodies 112 configured as clip frames have been mounted on each respective carrier body 102 so as to accomplish an electrically conductive connection between an upper main surface of each of the electronic components 100 and the assigned carrier body 102.

After singularization (prior to that the temporary support body 104 may be removed), individual packages 124 may be obtained. Each package comprises a section of a respective carrier body 102, a respective electronic component 100 and a respective clip as a separated piece of the clip frame type connection body 112.

In FIG. 14, the first alignment marks 106 are provided with a larger spatial extension D1, D2 than the second alignment marks 108 having a smaller spatial extension d1, d2, i.e. D1>d1 and/or D2>d2. In this example, D1 and d1 denote the diameter of the respective alignment mark 106, 108, whereas D2 and d2 denote the maximum distance between the respective type of alignment marks 106, 108. This simplifies a correct assignment of detected alignment marks 106, 108 to the support body 104 or the carrier bodies 102.

FIG. 15 illustrates a cross-sectional view of a support body 104 with different sets 138, 140 of alignment marks 106 according to an exemplary embodiment.

According to FIG. 15, the support body 104 comprises two different sets 138, 140 of alignment marks, said different sets 138, 140 being distinguishable by having different properties. For instance, said different sets 138, 140 comprise a first set 138 with larger spatial extension than a second set 140. Said first set 138 may serve for rough alignment and said second set 140 may serve for precise alignment. More specifically, the first set 138 is provided with a larger spatial extension D1, D2 than the second set 140 having a smaller spatial extension d1, d2, i.e. D1>d1 and/or D2>d2. In this example, D1 and d1 denote the diameter of the respective alignment mark 106, whereas D2 and d2 denote the maximum distance between the respective alignment marks 106 of a respective set 138, 140.

Thus, FIG. 15 shows a set 138 of alignment marks 106 having a large spatial dimension and a large spatial distance and being usable for a first stage rough alignment. For this purpose, a camera or the like having a large viewing angle can capture with moderate accuracy an image of the entire main surface of the structure shown in FIG. 15. Rough alignment may be carried out on the basis of said result. For further increasing accuracy, a refined alignment may then be carried out by the second set 140 of the alignment marks 106 which may be detected by a more accurate camera detecting only a smaller viewing angle and thus only a portion of the structure shown in FIG. 15. By combining alignment information derived from the first set 138 and the second set 140 of alignment marks 106, the precision of the alignment and therefore of the placing or assembly procedure may be further increased.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of mounting electronic components on one or more carrier bodies, wherein the method comprises:
providing a support body with at least one first alignment mark;
mounting the one or more carrier bodies, each having at least one second alignment mark, on the support body by optical alignment based on a correlation between the at least one first alignment mark and the at least one second alignment mark, the at least one first alignment mark spaced apart from the one or more carrier bodies after mounting to the support body;

thereafter mounting the plurality of electronic components on a respective one of the one or more carrier bodies by optical alignment using the at least one second alignment mark; and separating the one or more carrier bodies and the electronic components mounted thereon into separate packages, each at least comprising part of one of the one or more carrier bodies and at least one of the electronic components.

2. The method according to claim 1, wherein the method comprises providing each of the plurality of electronic components with at least one third alignment mark, wherein mounting the plurality of electronic components on a respective one of the one or more carrier bodies involves an optical alignment between the at least one second alignment mark and the third alignment marks.

3. The method according to claim 2, wherein the method comprises carrying out the optical alignment between the at least one second alignment mark and the third alignment marks without considering the at least one first alignment mark.

4. The method according to claim 1, wherein the method comprises optically detecting the at least one first alignment mark before mounting the one or more carrier bodies on the support body.

5. The method according to claim 1, wherein the method comprises optically detecting the at least one second alignment mark before mounting the one or more carrier bodies on the support body.

6. The method according to claim 1, wherein the method comprises mounting one or more connection bodies, each having at least one fourth alignment mark, on the one or more carrier bodies for electrically connecting the electronic components with a respective carrier body by a respective connection body.

7. The method according to claim 6, wherein the one or more connection bodies is or are one or more clip frames.

8. The method according to claim 6, wherein the method comprises mounting the one or more connection bodies on the one or more carrier bodies by optical alignment between the at least one second alignment mark and the at least one fourth alignment mark.

9. The method according to claim 1, wherein the method comprises forming at least part of the alignment marks by at least one of the group consisting of etching, printing, laser grooving, drilling, routing, and stamping.

10. The method according to claim 1, wherein the method comprises mounting the electronic components on the one or more carrier bodies by at least one of the group consisting of soldering, sintering, welding, and gluing.

11. A method of mounting electronic components on one or more carrier bodies, wherein the method comprises:

providing a support body with at least one first alignment mark;

mounting the one or more carrier bodies, each having at least one second alignment mark, on the support body by alignment between the at least one first alignment mark and the at least one second alignment mark;

thereafter mounting the plurality of electronic components on a respective one of the one or more carrier bodies by alignment using the at least one second alignment mark; and separating the one or more carrier bodies and the electronic components mounted thereon into separate packages, each at least comprising part of one of the one or more carrier bodies and at least one of the electronic components, wherein the method comprises:

mounting the plurality of electronic components on an intermediate carrier body having at least one fifth alignment mark by alignment taking into account mounting position and orientation of the one or more carrier bodies on the support body; and thereafter transferring the electronic components from the intermediate carrier body to the one or more carrier bodies by alignment using the at least one fifth alignment mark.

12. The method according to claim 11, wherein the method comprises picking the plurality of electronic components from a diced wafer and transferring the picked electronic components to the intermediate carrier body.

13. A method of mounting electronic components on leadframe-type carrier bodies, wherein the method comprises:

providing a support body having a first alignment mark;

mounting the plurality of carrier bodies on the support body, each carrier body having a second alignment mark; and mounting each of the electronic components on a respective one of the carrier bodies each electronic component having a third alignment mark;

wherein said mounting comprises carrying out first optical alignment procedures based on correlations between the first alignment mark of support body and the second alignment mark of each carrier body, and carrying out second optical alignment procedures based on correlations between the third alignment mark of each electronic component and the second alignment mark of the respective carrier body, the second optical alignment procedures independent of the first optical alignment procedures to eliminate compounding tolerances of the first and second optical alignment procedures; and separating the one or more carrier bodies and the electronic components mounted thereon into separate packages, each at least comprising part of one of the one or more carrier bodies and at least one of the electronic components.

14. A method of mounting electronic components on one or more carrier bodies, wherein the method comprises:

providing a support body having an upper major surface and an opposing lower major surface, the upper major surface including at least one first alignment mark;

the one or more carrier bodies; each having an upper major surface including at least one second alignment mark and an opposing lower major surface, mounting the lower major surface of each carrier body on the upper major surface of the support body by an alignment correlation between the at least one first alignment mark and the at least one second alignment mark, the at least one first alignment mark being spaced apart from the one or more carrier bodies on the upper major surface of the support body;

thereafter mounting the plurality of electronic components on the upper major surface of a respective one of the one or more carrier bodies by alignment using the at least one second alignment mark; and separating the one or more carrier bodies and the electronic components mounted thereon into separate packages, each at least comprising part of one of the one or more carrier bodies and at least one of the electronic components.

15. The method of claim 14, further comprising providing each of the plurality of electronic components with at least one third alignment mark on an upper major surface thereof, wherein mounting of each of the plurality of electronic components on the respective one of the one or more carrier bodies involves an alignment between the at least one second alignment mark of the respective carrier bodies and the third alignment marks, including disposing a lower major surface of the electronic component, which is opposite the lower major surface of the electronic component, on the upper major surface of the respective carrier body.

16. The method of claim 15, including disposing the second alignment marks beyond mounting positions of the one or more electronic components on the upper major surface of the respective carrier body.

\* \* \* \* \*